US009129686B2

(12) United States Patent
Hirose et al.

(10) Patent No.: US 9,129,686 B2
(45) Date of Patent: *Sep. 8, 2015

(54) SYSTEMS AND METHODS FOR PROVIDING HIGH VOLTAGE TO MEMORY DEVICES

(71) Applicant: Cypress Semiconductor Corporation, San Jose, CA (US)

(72) Inventors: Ryan T Hirose, Colorado Springs, CO (US); Bogdan I. Georgescu, Colorado Springs, CO (US); Leonard Vasile Gitlan, Colorado Springs, CO (US); Ashish Ashok Amonkar, Santa Clara, CA (US); Gary Peter Moscaluk, Colorado Springs, CO (US); John W. Tiede, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/286,497

(22) Filed: May 23, 2014

(65) Prior Publication Data

US 2014/0369136 A1  Dec. 18, 2014

Related U.S. Application Data

(63) Continuation of application No. 13/340,248, filed on Dec. 29, 2011, now Pat. No. 8,750,051.

(60) Provisional application No. 61/566,220, filed on Dec. 2, 2011.

(51) Int. Cl.
*G11C 16/04* (2006.01)
*G11C 16/14* (2006.01)
(Continued)

(52) U.S. Cl.
CPC ............. *G11C 16/14* (2013.01); *G11C 16/30* (2013.01); *G11C 16/3404* (2013.01); *H03K 3/35613* (2013.01); *H03K 19/0185* (2013.01)

(58) Field of Classification Search
CPC .... G11C 16/14; G11C 16/30; G11C 16/3404; G11C 16/3409; G11C 5/145; G11C 11/4074
USPC ............. 365/185.29, 185.11, 185.23, 185.24, 365/185.25, 185.18, 230.06, 208
See application file for complete search history.

(56) References Cited

U.S. PATENT DOCUMENTS 6,054,888 A   4/2000 Maley
6,259,627 B1  7/2001 Wong
(Continued)

OTHER PUBLICATIONS

U.S. Appl. No. 13/340,248: Systems and Methods for Providing High Voltage to Memory Devices, by Ryan Hirose filed Dec. 29, 2011; 42 pages.

(Continued)

*Primary Examiner* — Gene Auduong

(57) ABSTRACT

Apparatus, systems, and methods for providing high voltage to memory devices are provided. One apparatus includes a low voltage input and a two-rail level shifting. The two-rail level shifting is configured to increase the low voltage or to decrease the low voltage to an amount that is less than or equal to a ground potential based on the amount of the low voltage. A system includes a low voltage input for receiving a voltage and a two-rail level shifting coupled to the low voltage input. The two-rail level shifting is configured to increase the voltage to a positive voltage if the voltage is equal to a ground potential and decrease the voltage to a negative voltage if the voltage is greater than the ground potential. One method includes receiving a voltage, modifying the voltage to generate one of a plurality of output voltages, and providing the output voltage to a memory device.

20 Claims, 7 Drawing Sheets

(51) Int. Cl.
*G11C 16/34* (2006.01)
*G11C 16/30* (2006.01)
*H03K 3/356* (2006.01)
*H03K 19/0185* (2006.01)

(56) References Cited

U.S. PATENT DOCUMENTS

| | | | |
|---|---|---|---|
| 6,580,658 | B1 | 6/2003 | Hsu et al. |
| 6,590,420 | B1 | 7/2003 | Mnich et al. |
| 6,784,708 | B1 | 8/2004 | Krenzke |
| 6,838,924 | B1 | 1/2005 | Davies, Jr. |
| 6,944,059 | B2 * | 9/2005 | Macerola ............ 365/185.25 |
| 7,019,584 | B2 * | 3/2006 | Bartel et al. ............ 327/539 |
| 7,245,538 | B2 * | 7/2007 | Macerola ............ 365/185.25 |
| 7,288,964 | B2 | 10/2007 | Ku et al. |
| 7,429,873 | B2 | 9/2008 | Peschke |
| 7,518,403 | B2 | 4/2009 | Yang |
| 7,652,937 | B2 | 1/2010 | Searles et al. |
| 7,696,805 | B2 * | 4/2010 | Thorp et al. ............ 327/333 |
| 7,830,175 | B1 | 11/2010 | Lin et al. |
| 7,843,247 | B1 | 11/2010 | Bazes |
| 7,916,539 | B2 | 3/2011 | Barrow |
| 8,120,968 | B2 | 2/2012 | Reohr et al. |
| 8,750,051 | B1 * | 6/2014 | Hirose et al. ............ 365/185.29 |
| 2006/0133163 | A1 | 6/2006 | Darrer |
| 2007/0230248 | A1 | 10/2007 | Macerola |
| 2009/0212842 | A1 | 8/2009 | Illegems et al. |
| 2010/0188902 | A1 | 7/2010 | Barrow |
| 2011/0199837 | A1 | 8/2011 | Reohr et al. |

OTHER PUBLICATIONS

International Search Report for International Application No. PCT/US12/67636 dated Feb. 19, 2013; 3 pages.
USPTO Non-Final Rejection for U.S. Appl. No. 13/340,248 dated Jul. 18, 2013; 7 pages.
USPTO Non-Final Rejection for U.S. Appl. No. 13/340,248 dated Dec. 23, 2013; 16 pages.
USPTO Notice of Allowance for U.S. Appl. No. 13/340,248 dated Apr. 14, 2014; 5 pages.
USPTO Notice of Allowance for U.S. Appl. No. 13/340,248 dated Oct. 11, 2013; 7 pages.
Written Opinion of the International Searching Authority for International Application No. PCT/US12/67636 dated Feb. 19, 2013; 6 pages.

* cited by examiner

SYSTEMS AND METHODS FOR PROVIDING HIGH VOLTAGE TO MEMORY DEVICES

This application is a continuation of U.S. application Ser. No. 13/340,248, filed Dec. 29, 2011, which claims priority from U.S. Provisional Patent Application No. 61/566,220, filed Dec. 2, 2011, both of which are incorporated by reference herein in their entirety.

BACKGROUND OF THE INVENTION

1. Field of the Invention

The present invention relates generally to memory devices, and more particularly to, systems and methods for providing high voltage to memory devices.

2. Description of the Related Art

Previous memory systems use Silicon-Oxide-Nitride-Oxide-Silicon (SONOS) devices as Non-Volatile (NV) storage elements in the NV EEPROM or Flash Memories. These prior memory systems rely on the usage of SONOS devices with thicker gate oxide layers (e.g., 110A) for the high voltage operations related to programming and erasing of the NV Flash Macro.

Some prior memory devices have a voltage gate oxide (Vgox) maximum of 7.3 volts and a junction voltage (Vjunc) of 10.5 volts. Other prior memory devices have a maximum Vgox of 8.1 volts and a Vjunc of 7.6 volts. To make these memory devices compatible with high voltage levels, these memory devices had to be laid out as ring transistors.

More recent memory devices have a maximum Vgox of 6.9 volts and a Vjunc of 11.3 volts, while some other memory devices have a maximum Vgox of 7.7 volts and a Vjunc of 11.3 volts. While the supply voltage levels are decreasing in newer technologies, the NV memory devices still require relatively high voltage for NV operations. In other words, these voltages are still too high to be directly supported by memory devices with thinner gate oxide thicknesses (e.g., gate oxide thicknesses of 55 A) since memory devices with thinner gate oxide thicknesses can typically only handle low voltage. For example, memory devices with a gate oxide thickness of 55 A typically can handle a maximum of 2.5 volts. Thus, prior memory systems do not utilize memory devices with a gate oxide thickness of 55 A for high voltage applications.

Furthermore, as the interest for smaller and faster devices has increased, interest in SONOS device scale down has increased as well. However, the aforementioned high voltage signals used on devices with thicker gate oxides may cause stresses on the devices with thinner gate oxides. Although additional devices can be employed to mitigate such stresses, inclusion of such devices may increase costs and complicate circuit fabrication.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE DRAWINGS

Figure 1:
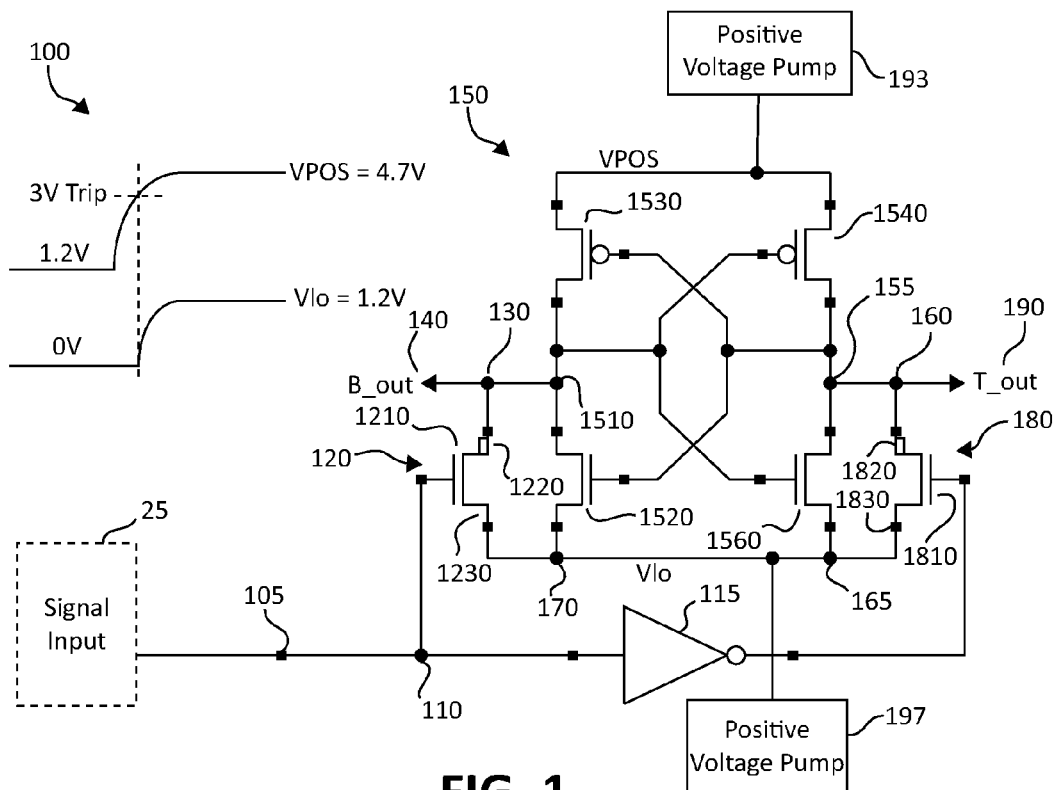
FIG. 1 is a schematic diagram of one embodiment of a two-rail level shifting circuit configured to provide positive voltage to a memory device and/or system.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

In the following detailed description, for purposes of explanation, numerous specific details are set forth in order to provide a thorough understanding of the subject matter of the present application. It will be evident, however, to one skilled in the art that the disclosed embodiments, the claimed subject matter, and their equivalents may be practiced without these specific details.

The detailed description includes references to the accompanying drawings, which form a part of the detailed description. The drawings show illustrations in accordance with example embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Various embodiments described herein include apparatus for providing high voltage to a memory device (e.g., a flash memory device). One apparatus comprises a two-rail level shifting circuit configured to receive a low voltage input. The low voltage input may have a first voltage (e.g. Vpwr) or a second voltage (e.g. Vgnd) that is less than the first voltage. The two-rail level shifting circuit is configured to have an output signal that can be at the first voltage or the second voltage during low voltage operations (e.g. read operations). The two-rail level shifting circuit is configured to have an output signal that can be at a third voltage (e.g. VPOS) or a fourth voltage (e.g. Vlo) during high voltage operations (e.g. erase operations or program operations). Here, the third voltage is higher than the first voltage and the fourth voltage is higher than the second voltage, but less than the third voltage.

Another apparatus comprises a two-rail level shifting circuit configured to receive a low voltage input. The low voltage input may have a first voltage (e.g. Vpwr) or a second voltage (e.g. Vgnd) that is less than the first voltage. The two-rail level shifting circuit is configured to have an output signal that can be at the first voltage or yjr second voltage during low voltage operations (e.g. read operations). The two-rail level shifting circuit is configured to have an output signal that can be at a fifth voltage (e.g. Vhi) or a sixth voltage (e.g. VNEG) during high voltage operations (e.g. erase operations or program operations). The fifth voltage is lower than the first voltage, but higher than the sixth voltage and the sixth voltage is lower than the second voltage.

Systems for providing high voltage to a memory device are also provided. One system comprises a low voltage input configured to receive a first voltage and a two-rail level shifting coupled to the low voltage input. The two-rail level shifting configured to increase the first voltage to a second voltage, which is a positive voltage, if the first voltage is equal to a ground potential and to decrease the first voltage to a third voltage, which is a negative voltage, if the first voltage is greater than the Vpwr potential. The system is further configured to provide the second voltage or the third voltage to the memory device when programming and erasing the memory device.

Other embodiments include methods for providing voltage from a two-rail level shifting to a memory device. One method comprises receiving, at the two-rail level shifting, a first voltage and modifying the first voltage to generate one of a plurality of output voltages based on the amount of the first voltage. The method further comprises providing the output voltage to the memory device when programming and erasing the memory device.

Turning now to the figures, FIG. 1 is a schematic diagram of one embodiment of a two-rail level shifting circuit 100. At least in the illustrated embodiment, two-rail level shifting circuit 100 comprises a low voltage input 105 capable of being coupled to a signal input 25 (e.g., a low voltage signal). In the embodiment illustrated in FIG. 1, signal input 25 is configured to comprise values of, for example, 0 volts and 1.2 volts; however, signal input 25 may comprise any voltage level depending on the application of two-rail level shifting circuit 100.

Low voltage input 105 is coupled to a node 110 that is coupled to an inverter 115. Node 110 is also coupled to an n-channel metal oxide semiconductor field-effect transistor (nMOSFET) 120.

To accommodate the high voltage across the gate oxide and across the drain to source, extended drain devices (e.g., nMOSFET 120 and nMOSFET 180) are included in the circuit. Such extended drain devices include drains that are extended by a low-doped semiconductor region that depletes during reverse biasing to thereby allow much of the voltage to be dropped across the drain area and to reduce the electric field across a gate oxide to a safe level.

nMOSFET 120 may be any device (including an extended drain device) capable of supporting the difference between low input voltage 105 and the top rail supply (VPOS). For example, if the low input voltage is 0 volts and VPOS is 4.7 volts, nMOSFET 120 should be at least a 5-volt rated device (i.e., 4.7V−0V=4.7V). As such, at least in the illustrated embodiment, nMOSFET 120 is a 5-volt rated device; however, nMOSFET 120 may be any voltage rated device depending on the difference between the low voltage input and the top rail supply. As illustrated, nMOSFET 120 comprises a gate 1210 coupled to node 110, an extended drain 1220, and a source 1230. Extended drain 1220 is coupled to a node 130 that is coupled to an output 140 (e.g., a "bar output" or B_out). Source 1230 and node 130 are each coupled to a low rail supply for a high voltage (HV) latch 150.

HV latch 150 comprises a pair of gate-to-drain cross-coupled inventers. Specifically, HV latch 150 comprises a node 1510 coupled to node 130. Node 1510 is coupled between the drain of an nMOSFET 1520 and the drain of a p-channel metal oxide semiconductor field-effect transistor (pMOSFET) 1530. The gates of nMOSFET 1520 and pMOSFET 1530 are coupled to each another and coupled to the drain of a pMOSFET 1540 and the drain of nMOSFET 1560.

The drain of pMOSFET 1540 is also coupled to a node 155 and the source of pMOSFET 1540 is coupled to the source of pMOSFET 1530 and to the top rail supply (e.g., VPOS) of two-rail level shifting circuit 100. Node 155 is coupled to the drain of an nMOSFET 1560 and a node 160 that is connected to the output T_out 190 (e.g., a "True_Output").

The gates of nMOSFET 1560 and pMOSFET 1540 are coupled to each other and coupled to the drains of pMOSFET 1530 and nMOSFET 1520. The source of nMOSFET 1560 is coupled to a node 165. Node 165 is coupled to a node 170, which is coupled to the source of nMOSFET 1520 and source 1230. Node 165 is also coupled to the source of nMOSFET 180. The coupling between node 165 and node 170 forms a bottom rail supply (e.g., Vlo) of two-rail level shifting circuit 100.

As illustrated, nMOSFET 180 comprises a gate 1810 coupled to the output of inverter 115. nMOSFET 180 further comprises a source 1830 coupled to node 165 and an extended drain 1820 coupled to node 160, which is coupled to an output 190 (e.g., a "true output" or T_out). nMOSFET 180 may be any device (including an extended drain device) capable of supporting the difference between low input voltage 105 and the top rail supply (VPOS). For example, if the low input voltage is 0 volts and VPOS is 4.7 volts, nMOSFET 180 should be at least a 5-volt rated device (e.g., 4.7V−0V=4.7V). As such, at least in the illustrated embodiment, nMOSFET 180 is a 5-volt rated device; however, nMOSFET 180 may be any voltage rated device depending on the difference between the low voltage input and the top rail supply.

The top rail supply is coupled to a positive voltage pump 193, which provides VPOS to two-rail level shifting circuit 100 via the top rail supply. Similarly, the bottom rail supply is coupled to a positive voltage pump 197, which provides Vlo to two-rail level shifting circuit 100 via the bottom rail supply.

Two-rail level shifting circuit 100 is configured to provide positive voltage to a memory device and/or system (not shown). The amount of positive voltage provided to the memory device and/or system depends on the application of two-rail level shifting circuit 100 and the amount of voltage provided to the top rail supply (VPOS) and the bottom rail supply (Vlo) by positive voltage pump 193 and positive voltage pump 197, respectively. That is, two-rail level shifting circuit 100 may be configured to provide any amount of and/or range of positive voltage to a memory device and/or system.

In one embodiment, HV latch 150 is set to desired voltage values when all of the signals are at low voltage levels (e.g., Vlo) when positive voltage pumps 193 and 197 are OFF. That is, the output of two-rail shifting circuit 100 will follow the voltages supplied by the top rail supply and the bottom rail supply, which go to VPOS and Vlo when positive pumps 193 and 197 are ON.

In various embodiments, two-rail level shifting circuit 100 is configured to receive a signal input 25 that can be at the ground potential voltage, represented by a logic "0" input, or at a voltage greater than the ground potential voltage, which may be represented by a logic "1" input. When low voltage input 105 has a voltage equal to the ground potential voltage (i.e., a logic 0 input), output 140 (i.e., B_out) includes a voltage output greater than output 190 (i.e., T_out). When low voltage input 105 has a voltage greater than the ground potential voltage (i.e., a logic 1 input), output 140 (i.e., B_out) includes a voltage output that is less than output 190 (i.e., T_out). As such, the voltage present on the top rail supply (i.e., VPOS) and the bottom rail supply (Vlo) will be output at B_out and T_out depending on the low voltage input.

Notably, B_out and T_out will be complementary outputs. That is, B_out for a logic 0 input will include the same voltage as T_out for a logic 1 input. Similarly, T_out for a logic 0 input will include the same voltage as B_out for a logic 1 input.

In the embodiment illustrated in FIG. 1, two-rail level shifting circuit 100 is configured to receive either zero volts (e.g., a ground potential voltage), which may be represented by a logic "0" input, or a voltage of about 1.2 volts, which may be represented by a logic "1" input, from signal input 25. In addition, the top rail supply (i.e., VPOS) is 4.7 volts and the bottom rail supply (i.e., Vlo) is 1.2 volts. When low voltage input 105 of two-rail level shifting circuit 100 has a voltage equal to the ground potential voltage or zero volts (i.e., a logic 0 input), output 140 (i.e., B_out) includes a voltage output of about 4.7 volts and output 190 (i.e., T_out) includes a voltage output of about 1.2 volts. When low voltage input 105 of two-rail level shifting circuit 100 has a voltage greater than the ground potential voltage or of about 1.2 volts (i.e., a logic 1 input), output 140 (i.e., B_out) includes a voltage output of about 1.2 volts and output 190 (i.e., T_out) includes a voltage output of about 4.7 volts.

The following explanation of the operation of two-rail level shifting circuit 100 may be helpful in better understanding two-rail level shifting circuit 100. However, the various embodiments of two-rail level shifting circuit 100 are not limited to the below explanation.

When the low voltage input to two-rail level shifting circuit 100 is a logic 0 or at the ground potential (e.g., zero volts) at node 110, nMOSFET 120 will be "OFF" and the output of inverter 115 will be a logic 0 (e.g., 1.2 volts), which turns "ON" nMOSFET 180. When nMOSFET 120 is OFF, B_out will have a voltage output of 4.7 volts via the top rail supply (i.e., VPOS). When nMOSFET 180 is ON, which results in T_out including an output voltage of 1.2 volts from the bottom rail supply (i.e., Vlo).

When the low voltage input to two-rail level shifting circuit 100 is a logic 1 or, as here, is at 1.2 volts, which is greater than the ground potential (e.g., zero volts) at node 110, nMOSFET 120 will be "ON" and the output of inverter 115 will be a logic 0 (e.g., 0 volts), which turns "OFF" nMOSFET 180. When nMOSFET 120 is ON, B_out will have a voltage output equal to Vlo via the bottom rail supply, which in this embodiment, is at 1.2 volts. When nMOSFET 180 is OFF, T_out includes an output voltage of 4.7 volts from the top rail supply (i.e., VPOS).

Figure 2:
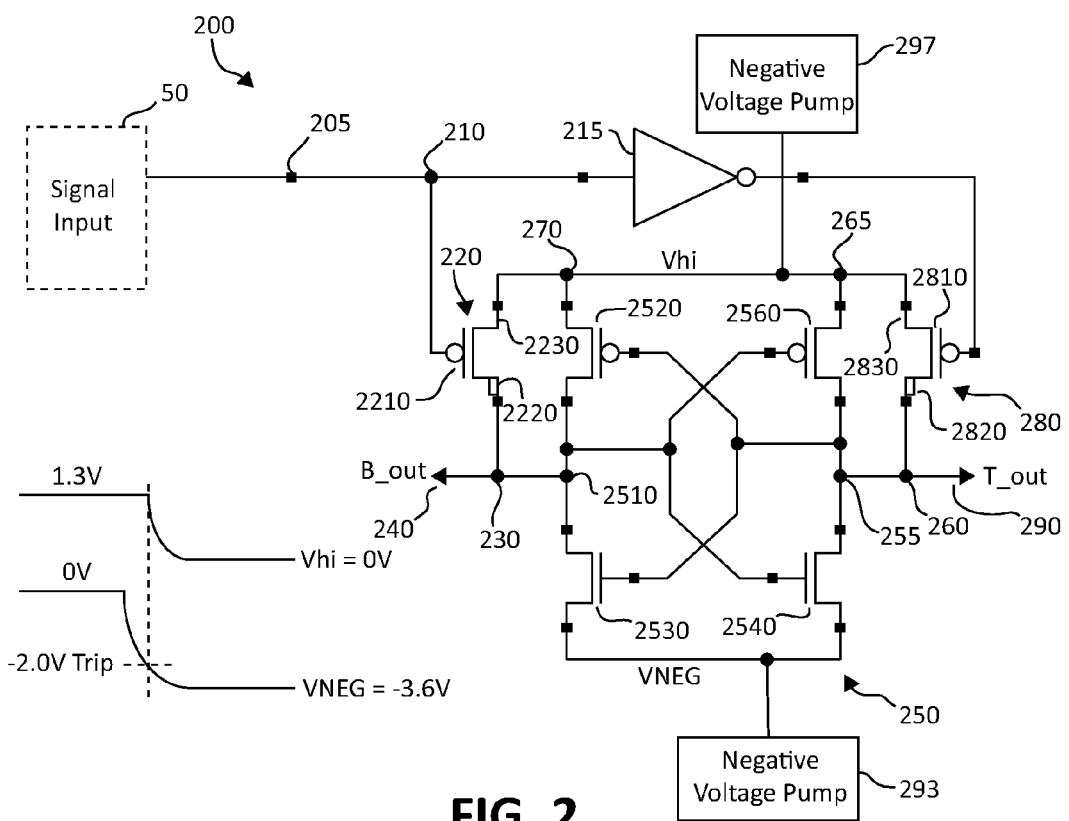
FIG. 2 is a schematic diagram of another embodiment of a two-rail level shifting circuit configured to provide negative voltage to a memory device and/or system.

With reference now to FIG. 2, FIG. 2 is a schematic diagram of another embodiment of a two-rail level shifting circuit 200. At least in the illustrated embodiment, two-rail level shifting circuit 200 comprises a low voltage input 205 capable of being coupled to a signal input 50 (e.g., a low voltage signal). In the embodiment illustrated in FIG. 2, signal input 50 is configured to generate 1.2 volts; however, signal input 50 may supply any voltage depending on the application of two-rail level shifting circuit 200.

Low voltage input 205 is coupled to a node 210 that is coupled to an inverter 215. Node 210 is also coupled to a pMOSFET 220.

To accommodate the high voltage across the gate oxide and across the drain to source, extended drain devices (e.g., pMOSFET 220 and pMOSFET 280) are included in the circuit. Such extended drain devices include drains that are extended by a low-doped semiconductor region that depletes during reverse biasing to thereby allow much of the voltage to be dropped across the drain area and to reduce the electric field across a gate oxide to a safe level.

pMOSFET 220 may be any device (including an extended drain device) capable of supporting the difference between low input voltage 205 and the bottom rail supply (VNEG). For example, if the low input voltage is 1.2 volts and VNEG is −3.8 volts, pMOSFET 220 should be at least a 5-volt rated device (i.e., 1.2V−(−3.8V)=4.8V). As such, at least in the illustrated embodiment, pMOSFET 220 is a 5-volt rated device; however, pMOSFET 220 may be any voltage rated device depending on the difference between the low voltage input and the bottom rail supply. As illustrated, pMOSFET 220 comprises a gate 2210 coupled to node 210, an extended drain 2220, and a source 2230. Extended drain 2220 is coupled to a node 230 that is coupled to an output 240 (e.g., a "bar output" or B_out). Source 2230 and node 230 are each coupled to a low rail supply for a HV latch 250.

HV latch 250 comprises a pair of gate-to-drain cross-coupled inverters. Specifically, voltage latch 250 comprises a node 2510 coupled to node 230. Node 2510 is coupled between the drain of a pMOSFET 2520 and the drain of an nMOSFET 2530. The gates of pMOSFET 2520 and nMOSFET 2530 are coupled to each another and coupled to the drain of an nMOSFET 2540 and the drain of nMOSFET 2560.

The drain of nMOSFET 2540 is also coupled to a node 255 and the source of nMOSFET 2540 is coupled to the source of nMOSFET 2530 and forms a bottom rail supply (e.g., VNEG) of two-rail level shifting circuit 200. Node 255 is coupled to the drain of a pMOSFET 2560 and a node 260.

The gates of pMOSFET 2560 and nMOSFET 2540 are coupled to each other and coupled to the drains of nMOSFET 2530 and pMOSFET 2520. The source of pMOSFET 2560 is coupled to a node 265. Node 265 is coupled to a node 270, which is coupled to the source of pMOSFET 2520 and source 2230. Node 265 is also coupled to the source of pMOSFET 280. The coupling between node 265 and node 270 forms a top rail supply (e.g., Vhi) of two-rail level shifting circuit 200.

As illustrated, pMOSFET 280 comprises a gate 2810 coupled to the output of inverter 215. pMOSFET 280 further comprises a source 2830 coupled to node 265 and an extended drain 2820 coupled to node 260, which is coupled to an output 290 (e.g., a "true output" or T_out). pMOSFET 280 may be any device (including an extended drain device) capable of supporting the difference between low input voltage 205 and the bottom rail supply (VNEG). For example, if the low input voltage is 1.2 volts and VNEG is −3.6 volts, pMOSFET 280 should be at least a 5-volt rated device (e.g., 1.2V−(−3.6V)= 4.8V). As such, at least in the illustrated embodiment, pMOSFET 280 is a 5-volt rated device; however, pMOSFET 280 may be any voltage rated device depending on the difference between the low voltage input and the bottom rail supply.

The bottom rail supply is coupled to a negative voltage pump 293, which provides VNEG to two-rail level shifting circuit 200 via the bottom rail supply. Similarly, the top rail supply is coupled to a negative voltage pump 297, which provides Vhi to two-rail level shifting circuit 200 via the top rail supply.

Two-rail level shifting circuit 200 is configured to provide negatively shifted voltage to a memory device and/or system (not shown). The amount of negative voltage provided to the memory device and/or system depends on the application of two-rail level shifting circuit 200 and the amount of voltage provided to the bottom rail supply (VNEG) and the top rail supply (Vhi) by negative voltage pump 293 and negative voltage pump 297, respectively. That is, two-rail level shifting circuit 200 may be configured to provide any amount of and/or range of negative voltage to a memory device and/or system.

In one embodiment, HV latch 250 is set to desired voltage values when all of the signals are at low voltage levels (e.g., Vhi) when negative voltage pumps 293 and 297 are OFF. That is, the output of two-rail shifting circuit 200 will follow the voltages supplied by the bottom rail supply and the top rail supply, which go to VNEG and Vhi, respectively.

In various embodiments, two-rail level shifting circuit 200 is configured to receive a ground potential voltage, which may be represented by a logic "0" input, or a voltage greater than the ground potential voltage, which may be represented by a logic "1" input, from signal input 50. When low voltage input 205 has a voltage equal to the ground potential voltage (i.e., a logic 0 input), output 240 (i.e., B_out) includes a voltage output greater than output 290 (i.e., T_out). When low voltage input 205 has a voltage greater than the ground potential voltage (i.e., a logic 1 input), output 240 (i.e., B_out) includes a voltage output that is less than output 290 (i.e., T_out). As such, the voltage present on the bottom rail supply (i.e., VNEG) and the top rail supply (Vhi) will be output at B_out and T_out depending on the low voltage input.

Notably, B_out and T_out will be complementary outputs. That is, B_out for a logic 0 input will include the same voltage as T_out for a logic 1 input. Similarly, T_out for a logic 0 input will include the same voltage as B_out for a logic 1 input.

In the embodiment illustrated in FIG. 2, two-rail level shifting circuit 200 is configured to receive either zero volts (e.g., a ground potential voltage), which may be represented by a logic "0" input, or a voltage of about 1.2 volts, which may be represented by a logic "1" input, from signal input 50. In addition, the bottom rail supply (i.e., VNEG) is −3.6 volts and the top rail supply (i.e., Vhi) is 0 volts. When low voltage input 205 of two-rail level shifting circuit 200 has a voltage equal to the ground potential voltage or zero volts (i.e., a logic 0 input), output 240 (i.e., B_out) includes a voltage output of about 0 volts and output 290 (i.e., T_out) includes a voltage output of about −3.6 volts. When low voltage input 205 of two-rail level shifting circuit 200 has a voltage greater than the ground potential voltage or of about 1.2 volts (i.e., a logic 1 input), output 240 (i.e., B_out) includes a voltage output of about −3.6 volts and output 290 (i.e., T_out) includes a voltage output of about 0 volts.

The following explanation of the operation of two-rail level shifting circuit 200 may be helpful in better understanding two-rail level shifting circuit 200. However, the various embodiments of two-rail level shifting circuit 200 are not limited to the below explanation.

When the low voltage input to two-rail level shifting circuit 200 is at a logic 0 or at the ground potential (e.g., zero volts) at node 210, pMOSFET 220 will be "ON" and the output of inverter 215 will be 1.2 volts, which turns "OFF" pMOSFET 280. When pMOSFET 220 is ON, B_out will have a voltage output of 0 volts via the top rail supply (i.e., Vhi). When pMOSFET 280 is OFF, T_out includes an output voltage of −3.6 volts from the bottom rail supply (i.e., VNEG).

When the low voltage input to two-rail level shifting circuit 200 is at a logic 1 or, as here, is 1.2 volts, which is greater than the ground potential (e.g., zero volts) at node 210, pMOSFET 220 will be "OFF" and the output of inverter 215 will be 0 volts, which turns "ON" pMOSFET 280. When pMOSFET 220 is OFF, B_out will have a voltage output of −3.6 volts via the bottom rail supply (i.e., VNEG). When pMOSFET 280 is ON, T_out includes an output voltage of 0 volts from the top rail supply (i.e., Vhi).

Figure 3:
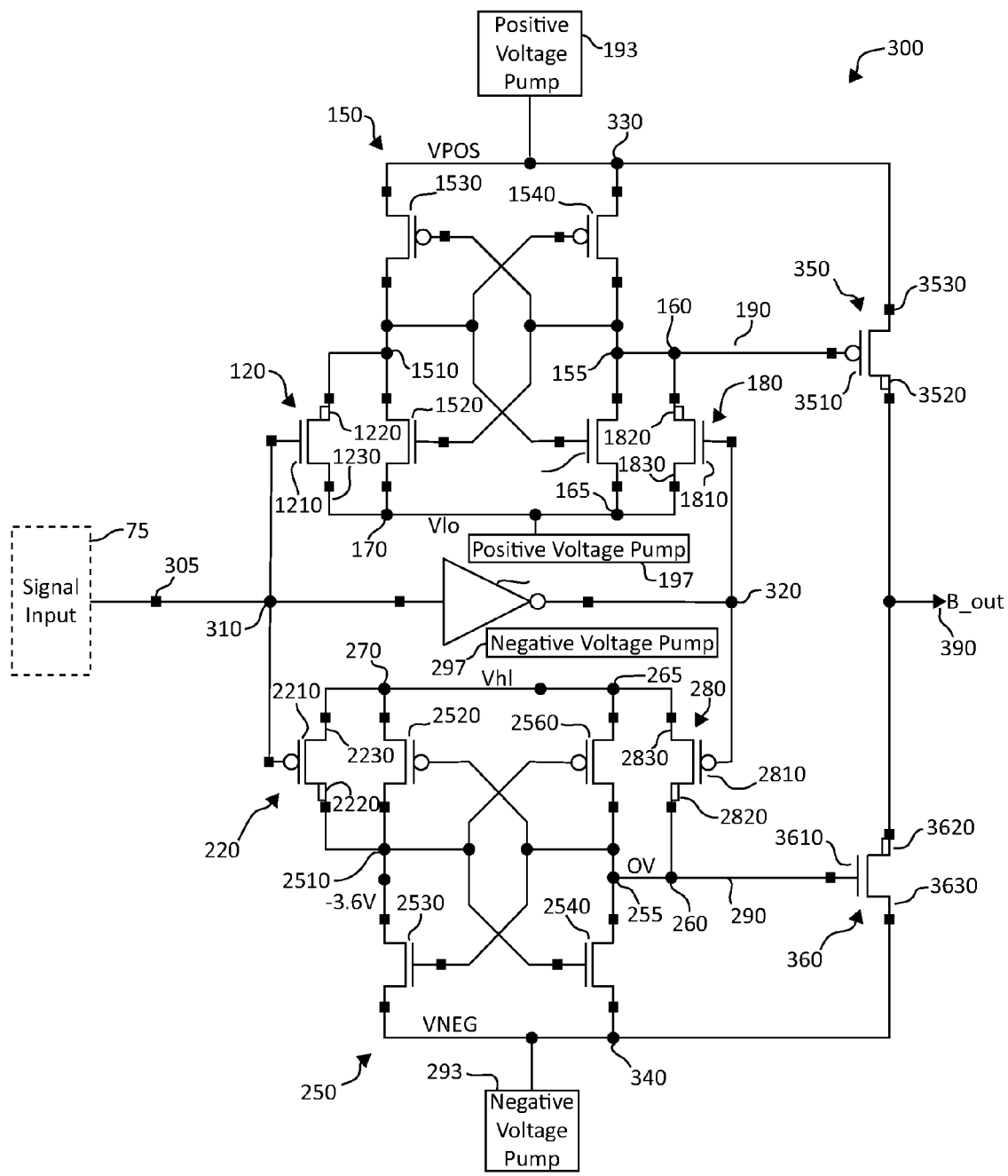
FIG. 3 is a schematic diagram of yet another embodiment of a two-rail level shifting circuit configured to provide positive voltage and negative voltage to a memory device and/or system.

With reference now to FIG. 3, FIG. 3 is a schematic diagram of yet another embodiment of a two-rail level shifting circuit 300, which comprises a substantial portion of two-rail level shifting circuit 100 and a substantial portion of two-rail level shifting circuit 200. At least in the illustrated embodiment, two-rail level shifting circuit 300 comprises a low voltage input 305 capable of being coupled to a signal input 75 (e.g., a low voltage signal). In the embodiment illustrated in FIG. 3, signal input 75 is configured to generate 1.2 volts; however, signal input 75 may generate any voltage depending on the application of two-rail level shifting circuit 300.

Low voltage input 305 is coupled to a node 310 that is coupled to an inverter 315. Node 310 is also coupled to an nMOSFET 120.

To accommodate the high voltage across the gate oxide and across the drain to source, extended drain devices (e.g., nMOSFET 120, nMOSFET 180, pMOSFET 220, pMOSFET 280, pMOSFET 350, and nMOSFET 360) are included in the circuit. Such extended drain devices include drains that are extended by a low-doped semiconductor region that depletes during reverse biasing to thereby allow much of the voltage to be dropped across the drain area and to reduce the electric field across a gate oxide to a safe level.

nMOSFET 120 may be any device (including an extended drain device) capable of supporting the difference between low input voltage 105 and the positive top rail supply (VPOS). For example, if the low input voltage is 0 volts and VPOS is 4.7 volts, nMOSFET 120 should be at least a 5-volt rated device (i.e., 4.7V−0V=4.7V). As such, at least in the illustrated embodiment, nMOSFET 120 is a 5-volt rated device; however, nMOSFET 120 may be any voltage rated device depending on the difference between the low voltage input and the positive top rail supply. As illustrated, nMOSFET 120 comprises a gate 1210 coupled to node 310, an extended drain 1220, and a source 1230. Extended 1220 and source 1230 are each coupled to a HV latch 150.

HV latch 150 comprises a pair of gate-to-drain cross-coupled inventers. Specifically, voltage latch 150 comprises a node 1510 coupled to extended drain 1220. Node 1510 is coupled between the drain of an nMOSFET 1520 and the drain of a p-channel metal oxide semiconductor field-effect transistor (pMOSFET) 1530. The gates of nMOSFET 1520 and pMOSFET 1530 are coupled to each another and coupled to the drains of a pMOSFET 1540 and nMOSFET 1560.

The drain of pMOSFET 1540 is also coupled to a node 155. The source of pMOSFET 1540 and the source of pMOSFET 1530 are each coupled to a node 330, which forms a positive top rail supply (e.g., VPOS) of two-rail level shifting circuit 300. Node 155 is coupled to the drain of an nMOSFET 1560 and a node 160.

The gates of nMOSFET 1560 and pMOSFET 1540 are coupled to each other and coupled to the drains of pMOSFET 1530 and nMOSFET 1520. The source of nMOSFET 1560 is coupled to a node 165. Node 165 is coupled to a node 170, which is coupled to the source of nMOSFET 1520 and source 1230. Node 165 is also coupled to nMOSFET 180. The coupling between node 165 and node 170 forms a positive bottom rail supply (e.g., Vlo) of two-rail level shifting circuit 300.

As illustrated, nMOSFET 180 comprises a gate 1810 coupled to the output of inverter 315. nMOSFET 180 further comprises a source 1830 coupled to node 165 and an extended drain 1820 coupled to node 160, which is coupled to an output 190. nMOSFET 180 may be any device (including an extended drain device) capable of supporting the difference between low input voltage 105 and the positive top rail supply (VPOS). For example, if the low input voltage is 0 volts and VPOS is 4.7 volts, nMOSFET 180 should be at least a 5-volt rated device (e.g., 4.7V−0V=4.7V). As such, at least in the illustrated embodiment, nMOSFET 180 is a 5-volt rated device; however, nMOSFET 180 may be any voltage rated device depending on the difference between the low voltage input and the positive top rail supply.

Node 310 is also coupled to a pMOSFET 220. pMOSFET 220 may be any device (including an extended drain device) capable of supporting the difference between low input voltage 305 and the negative bottom rail supply (VNEG). For example, if the low input voltage is 1.2 volts and VNEG is −3.6 volts, pMOSFET 220 should be at least a 5-volt rated device (i.e., 1.2V−(−3.6V)=4.8V). As such, at least in the illustrated embodiment, pMOSFET 220 is a 5-volt rated device; however, pMOSFET 220 may be any voltage rated device depending on the difference between the low voltage input and the negative bottom rail supply. As illustrated, pMOSFET 220 comprises a gate 2210 coupled to node 310, an extended drain 2220, and a source 2230. Extended drain 2220 and source 2230 are each coupled to a HV latch 250.

HV latch 250 comprises a pair of gate-to-drain cross-coupled inverters. Specifically, voltage latch 250 comprises a node 2510 coupled to extended drain 2220. Node 2510 is coupled between the drain of a pMOSFET 2520 and the drain of an nMOSFET 2530. The gates of pMOSFET 2520 and nMOSFET 2530 are coupled to each another and coupled to the drain of an nMOSFET 2540 and the drain of pMOSFET 2560.

The drain of nMOSFET 2540 is also coupled to a node 255. The source of nMOSFET 2540 and the source of nMOSFET 2530 are coupled to a node 340, which forms a negative bottom rail supply (e.g., VNEG) of two-rail level shifting circuit 300. Node 255 is coupled to the drain of a pMOSFET 2560 and a node 260.

The gates of pMOSFET 2560 and nMOSFET 2540 are coupled to each other and coupled to the drains of nMOSFET 2530 and pMOSFET 2520. The source of pMOSFET 2560 is coupled to a node 265. Node 265 is coupled to a node 270, which is coupled to the source of pMOSFET 2520 and source 2230. Node 265 is also coupled to pMOSFET 280. The coupling between node 265 and node 270 forms a negative top rail supply (e.g., Vhi) of two-rail level shifting circuit 300.

As illustrated, pMOSFET 280 comprises a gate 2810 coupled to the output of inverter 315. pMOSFET 280 further comprises a source 2830 coupled to node 265 and an extended drain 2820 coupled to node 260, which is coupled to an output 290. pMOSFET 280 may be any device (including an extended drain device) capable of supporting the difference between low input voltage 305 and the negative bottom rail supply (VNEG). For example, if the low input voltage is 1.2 volts and VNEG is −3.6 volts, pMOSFET 280 should be at least a 5-volt rated device (e.g., 1.2V−(−3.6V)=4.8V). As such, at least in the illustrated embodiment, pMOSFET 280 is a 5-volt rated device; however, pMOSFET 280 may be any voltage rated device depending on the difference between the low voltage input and the negative bottom rail supply.

Two-rail level shifting circuit 300 further comprises a pMOSFET 350 coupled to latch 150 and an output 390 (e.g., B_out). As illustrated, pMOSFET 350 comprises a gate 3510 coupled to output 190 of HV latch 150, an extended drain 3520 coupled to output 390, and a source 3530 coupled to node 330. pMOSFET 350 may be any device (including an extended drain device) capable of supporting the difference between the positive top rail supply (VPOS) and the negative bottom rail supply (VNEG). For example, if VPOS is 4.7 volts and VNEG is −3.6 volts, pMOSFET 350 should be at least a 9-volt rated device (e.g., 4.7V−(−3.6V)=8.3V). As such, at least in the illustrated embodiment, pMOSFET 350 is a 9-volt rated device; however, pMOSFET 350 may be any voltage rated device depending on the difference between the positive top rail supply and the negative bottom rail supply.

Furthermore, two-rail level shifting circuit 300 comprises an nMOSFET 360 coupled to latch 250 and output 390. As illustrated, nMOSFET 360 comprises a gate 3610 coupled to output 290, an extended drain 3620 coupled to output 390, and a source 3630 coupled to node 340. nMOSFET 360 may be any device (including an extended drain device) capable of supporting the difference between VPOS and VNEG. For example, if VPOS is 4.7 volts and VNEG is −3.6 volts, nMOSFET 360 should be at least a 9-volt rated device (e.g., 4.7V−(−3.6V)=8.3V). As such, at least in the illustrated embodiment, nMOSFET 360 is a 9-volt rated device; however, nMOSFET 360 may be any voltage rated device depending on the difference between the positive top rail supply and the negative bottom rail supply.

The positive top rail supply is coupled to a positive voltage pump 193, which provides VPOS to two-rail level shifting circuit 300 via the positive top rail supply. Similarly, the positive bottom rail supply is coupled to a positive voltage pump 197, which provides Vlo to two-rail level shifting circuit 300 via the positive bottom rail supply.

Similarly, the negative bottom rail supply is coupled to a negative voltage pump 293, which provides VNEG to two-rail level shifting circuit 300 via the negative bottom rail supply. Furthermore, the negative top rail supply is coupled to a negative voltage pump 297, which provides Vhi to two-rail level shifting circuit 300 via the negative top rail supply.

Two-rail level shifting circuit 300 is configured to provide a positive voltage (VPOS) or a negative voltage (VNEG) to a memory device and/or system (not shown). The amount of positive voltage or negative voltage provided to the memory device and/or system depends on the application of two-rail level shifting circuit 300 and the amount of voltage provided to the positive top rail supply (VPOS) and the negative top rail supply (VNEG), respectively. That is, two-rail level shifting circuit 300 may be configured to provide any amount of positive voltage (VPOS) or negative voltage (VNEG) to a memory device and/or system.

In various embodiments, two-rail level shifting circuit 300 is configured to receive a ground potential voltage, which may be represented by a logic "0" input, or a voltage greater than the ground potential voltage, which may be represented by a logic "1" input, from signal input 75. When low voltage input 305 has a voltage equal to the ground potential voltage (i.e., a logic 0 input), output 390 (i.e., B_out) presents a positive voltage (VPOS) via the positive top rail supply. When low voltage input 305 has a voltage greater than the ground potential voltage (i.e., a logic 1 input), output 390 presents a negative voltage (VNEG) via the negative bottom rail supply.

Notably, two-rail level shifting circuit 300 forms an inverter block. That is, a logic 0 input will generate a logic 1 output or a positive voltage (VPOS) output. Similarly, a logic 1 input will generate a logic 0 output or a negative voltage (VNEG) output.

In the embodiment illustrated in FIG. 3, two-rail level shifting circuit 300 is configured to receive either zero volts (e.g., a ground potential voltage), which may be represented by a logic "0" input, or a voltage of about 1.2 volts, which may be represented by a logic "1" input, from signal input 75.

In addition, the positive top rail supply (i.e., VPOS) is 4.7 volts, the positive bottom rail supply (i.e., Vlo) is 1.2 volts, the negative bottom rail supply (i.e., VNEG) is −3.6 volts, and the negative top rail supply (i.e., Vhi) is 0 volts. When low voltage input 305 of two-rail level shifting circuit 300 has a voltage equal to the ground potential voltage or zero volts (i.e., a logic 0 input), output 390 includes a voltage output of about 4.7 volts. When low voltage input 305 of two-rail level shifting circuit 300 has a voltage greater than the ground potential voltage or a voltage of about 1.2 volts (i.e., a logic 1 input), output 390 includes a voltage output of about −3.6 volts.

The following explanation of the operation of two-rail level shifting circuit 300 may be helpful in better understanding two-rail level shifting circuit 300. However, the various embodiments of two-rail level shifting circuit 300 are not limited to the below explanation.

When the low voltage input to two-rail level shifting circuit 300 is a logic 0 or at the ground potential (e.g., zero volts) at node 310, nMOSFET 120 will be "OFF" and pMOSFET 220 will be "ON" and the output of inverter 315 will be 1.2 volts, which turns "OFF" pMOSFET 280, while nMOSFET 180 is ON. When nMOSFET 120 is OFF and nMOSFET 180 is ON, output 190 will be 1.2 volts, which turns ON pMOSFET 350 such that output 390 (i.e., B_out) includes a voltage of 4.7 volts or VPOS. When pMOSFET 220 is ON and pMOSFET 280 is OFF, output 290 will have a voltage of −3.6 volts, which results in nMOSFET 360 being OFF.

Here, HV latch 150 is set to the desired logic values (e.g., "0" or "1") when all of the signals are at low voltage levels (e.g., 0V or 1.2V) when positive voltage pumps 193 and 197 are OFF. When positive voltage pumps 193 and 197 are ON, output 190 will follow the voltages supplied by the positive top rail supply and the positive bottom rail supply.

Alternatively, when the low voltage input to two-rail level shifting circuit 300 is a logic 1 or at a voltage greater than the ground potential at node 310, nMOSFET 120 will be ON and pMOSFET 220 will be OFF and the output of inverter 315 will be 0 volts, which turns OFF nMOSFET 180, while pMOSFET 280 is ON. When pMOSFET 220 is OFF and pMOSFET 280 is ON, output 290 will be 0 volts, which turns ON nMOSFET 360 such that output 390 includes a voltage of −3.6 volts or VNEG. When nMOSFET 120 is ON and nMOSFET 180 is OFF, output 190 will have a voltage of 4.7 volts, which results in pMOSFET 350 being OFF.

Here, HV latch 250 is also set to the desired logic value (e.g., "0" or "1") when all of the signals are at low voltage levels (e.g., 0V or 1.2V) when negative voltage pumps 293 and 297 are OFF. When negative voltage pumps 293 and 297 are ON, output 290 will follow the voltages supplied by the negative top rail supply and the negative bottom rail supply.

The signals Vlo and Vhi act as alternative power supplies in two-rail level shifting circuit 300 and Vlo and Vhi are biasing a large number of HV switches throughout the circuit. The two output values for Vhi and Vlo are dependent on the level of VNEG and VPOS, respectively.

In low voltage mode, the voltages at the output of the voltage pumps are VPOS=Vpwr and VNEG=Vgnd. Since HV Gate Oxide (GOX) stress cannot occur under the biases, Vhi=Vpwr and Vlo=Vgnd. When the pumps are started up, the outputs VPOS and VNEG start moving towards their HV voltage levels (e.g., 4.6V and −3.6V). When the voltages cross a specific voltage level (e.g. +3.0V for VPOS (see FIG. 1) and −2.0V for VNEG (see FIG. 2)), the Vlo value switches to Vpwr (e.g., 1.2V) and the Vhi value switches to the Vgnd level (e.g., 0V).

Figure 4:
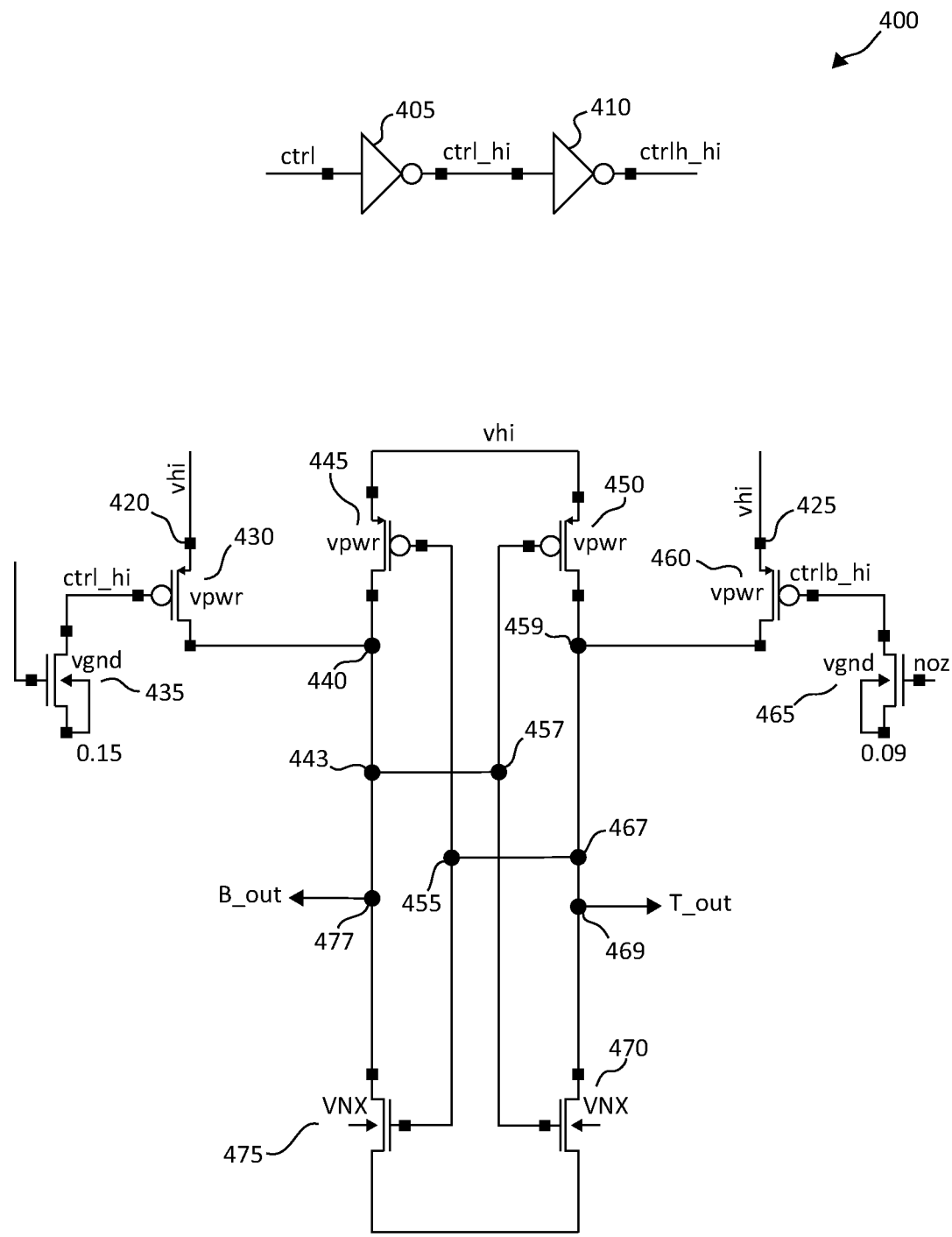
FIG. 4 is a schematic diagram of one embodiment of a collapsible power supply circuit.

With reference now to FIG. 4, FIG. 4 is a schematic diagram of one embodiment of a collapsible power supply circuit 400. At least in the illustrated embodiment, the collapsible power supply (Vhi) and circuit comprises an inverter 405, an inverter 410, and an input signal NOZ for controlling the output voltage of the collapsible power supply Vhi. Inverter 405 and inverter 410 are independently controlled and are configured to generate a ctrl_hi signal and a ctrlb_hi, respectively, which may be any value and/or range or values depending on the application of collapsible power supply Vhi.

Collapsible power supply circuit 400 further comprises output 420 and output 425. Output 420 is coupled to the source of a pMOSFET 430. The gate of pMOSFET 430 is coupled to the drain of an nMOSFET 435 and the drain of pMOSFET 430 is coupled to a node 440 that is coupled to a node 443.

The gate of nMOSFET 435 is coupled to the input signal NOZ. The source of nMOSFET 435 is coupled to a ground potential (Vgnd).

Node 440 is also coupled to the drain of a pMOSFET 445. The source of pMOSFET 445 is coupled to the source of a pMOSFET 450 and the gate of pMOSFET 445 is coupled to a node 455.

The gate of pMOSFET 450 is coupled to a node 457, which is coupled to node 443. The drain of pMOSFET 450 is coupled to a node 459, which is coupled to the drain of a pMOSFET 460.

The source of pMOSFET 460 is coupled to output 425 and the gate of pMOSFET 460 is coupled to the drain of an nMOSFET 465. The gate of nMOSFET 465 is coupled to the input signal NOZ and the source of nMOSFET 465 is coupled to the ground potential (Vgnd).

Node 459 is coupled to a node 467, which is coupled to node 455 and a node 469. Node 469 is also coupled to an output T_out and the drain of an nMOSFET 470.

The gate of nMOSFET 470 is coupled to node 457 and the source of nMOSFET 470 is coupled to the source of an nMOSFET 475, which forms the bottom rail for the latch powered by VNEG. The gate of nMOSFET 475 is coupled to node 455 and the drain of nMOSFET 475 is coupled to a node 477, which is coupled to node 443 and is coupled to an output B-out.

A benefit of using the Vhi signal as a power supply is that Vhi is "collapsible" once the voltage threshold values are reached. Specifically, inverters 405 and 410 have the top rail supply provided by Vhi.

The following explanation of the operation of collapsible power supply circuit 400 may be helpful in better understanding collapsible power supply circuit 400. However, the various embodiments of collapsible power supply circuit 400 are not limited to the below explanation.

In low voltage mode, Vhi is at the Vpwr level and VNEG at Vgnd level. The signals ctrl_hi and ctrlb_hi are setting the latch structure in collapsible power supply circuit 400 to the desired voltage value.

In high voltage mode, when VNEG drops below the threshold voltage (e.g. −2V) Vhi transitions to vgnd level and the outputs of both inverters 405 and 410 are either Vgnd or tri-stated. By having both "ctrl_hi" and "ctrlb_hi" pulled to Vgnd level, drain voltage stress for pMOSFET 430 and pMOSFET 460 is avoided.

With one or both outputs tri-stated (depending on the value of the "ctrl" signal), the need for the signal "NOZ" is raised, which is the inverted logic value of Vhi. That is, when Vhi is equal to a logic 1 (e.g., 1.2 volts), the output signal will be a logic 0 (e.g., 0 volts or Vgnd). Alternatively, when Vhi is a logic 0 (e.g., at Vgnd or 0 volts), the output signal will be at a logic 1 (e.g., 1.2 volts or Vpwr).

Specifically, when the ctrl signal is a logic 0, pMOSFET 445 and nMOSFET 470 will each be OFF and pMOSFET 450 and nMOSFET 475 will each be ON. With pMOSFET 445 and nMOSFET 470 both OFF and pMOSFET 450 and nMOSFET 475 both ON, the output signal will be a logic 1 signal or a 1.2 volt signal during high voltage modes when Vhi is at 0 volts. During low voltage modes, when Vhi is at the Vpwr level (e.g., 1.2 volts), the input signal NOZ is at Vgnd level (e.g., 0 volts).

Alternatively, when the ctrl signal is a logic 1, pMOSFET 445 and nMOSFET 470 will each be ON and pMOSFET 450 and nMOSFET 475 will each be OFF. With pMOSFET 445 and nMOSFET 470 both ON and pMOSFET 450 and nMOSFET 475 both OFF, NOZ will be a logic 0 signal or a 0 volt signal in low voltage mode and 1.2 volts during high voltage mode when Vhi is at the Vgnd level.

While the values of 0 volts, 1.2 volts, 4.7 volts, and −3.6 volts have been used in this example, collapsible power supply circuit 400 is not limited to these values. Rather, the values of a logic 0 signal, a logic 1 signal, a Vgnd signal, a Vpwr signal, a VPOS signal, and a VNEG signal may include other values for a logic 0 signal, a logic 1 signal, a Vgnd signal, a Vpwr signal, a VPOS signal, and a VNEG signal as desired for various applications of collapsible power supply circuit 400.

Figure 5:
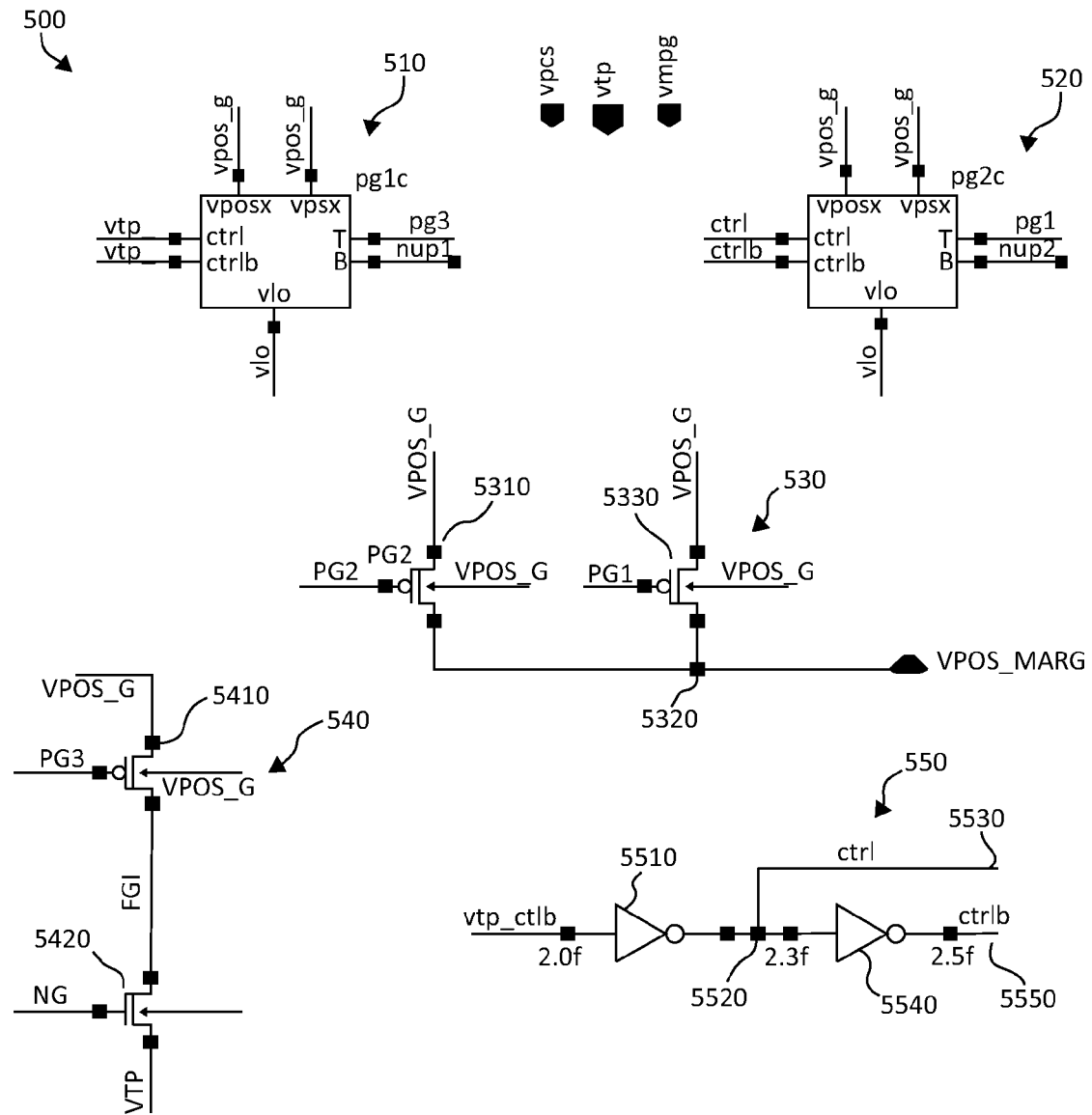
FIG. 5 is a schematic diagram of one embodiment of a dynamically switching circuit for gate voltages.

Turning now to FIG. 5, FIG. 5 is a schematic diagram of one embodiment of a dynamic switching circuit 500 for gate voltages. Dynamic switching circuit 500 is configured for use in operations (e.g., Margin Mode) during which signals are passed to the memory array with a wide range of variation (e.g. from −2.5V to +2.5V in incremental steps) to ensure signal integrity and gate oxide protection in MOSFET devices.

At least in the illustrated embodiment, dynamic switching circuit 500 comprises a switch 510, a switch 520, a circuit 530, a circuit 540, and a circuit 550. Switch 510 and switch 520 are configured to provide control signals (e.g., PG3 in switch 510 and PG1 in switch 520) to circuits 530, 540, and 550 based on received digital signals.

Circuit 530 comprises a pMOSFET 5310 including a drain coupled to a signal VMARGI and a gate coupled to a signal PG2. The source of pMOSFET 5310 is coupled to a node 5320 that is coupled to an output (VPOS_MARG) and the drain of a pMOSFET 5330.

The gate of pMOSFET 5330 is coupled to the signal PG1 in switch 520. The source of pMOSFET 5330 is coupled to the signal VPOS_G supplying switch 510 and switch 520.

Circuit 540 comprises a pMOSFET 5410 including a source coupled to the signal VPOS_G that supplies switches 510 and 520. The gate in pMOSFET 5410 is coupled to the signal PG3 in switch 510 and the drain of pMOSFET 5410 is coupled to the drain of an nMOSFET 5420 and forms signal PG2.

The gate of nMOSFET 5420 is coupled to a signal NG. The source of nMOSFET 5420 is coupled to a signal VTP.

Circuit 550 comprises an inverter 5510 configured to receive the control signals vtp_ctrl and vtp_ctrlb and output the control signals ctrl and ctrlb, respectively. Inverter is also coupled to a node 5520, which is coupled to an output 5530. Node 5520 is also coupled to an inverter 5540, which is coupled to an output 5550.

In Positive Margin Mode, the signal VMARGI has a bias of 0 volts to 2.5 volts controllable by a setting in the VMARGI generating circuit (not shown). The VMARGI bias is passed to the VPOS_MARG signal. The control of the gate in pMOSFET 5310 is accomplished by the signal VTP, which is less than the VMARG present at the source of pMOSFET 5310. Therefore, in Margin Mode the settings correspond to 0<VMARGI<1.25V (i.e. DAC MSB=0), PG2=VTP=−1.8V, and VGOX<3.63V and |VGS|>Vth.

However, the gate bias cannot be present at the gate for the highest settings (e.g., when VMARG gets close to 2.5V) because of the stress on the GOX for pMOSFET 5310. Thus, based on the value of DAC MSB, the bias is switched for VTP. Specifically, for Positive Margin Mode when the DAC MSB is equal 1, the VTP is switched to 0V (e.g., Vgnd) and VTP=PG2=0V, with VGOX<3.63V and |VGS|>Vth. By using biases that are dependent on the VMARG value, pMOSFET 5310 is ON and protected across the entire range.

Figure 6:
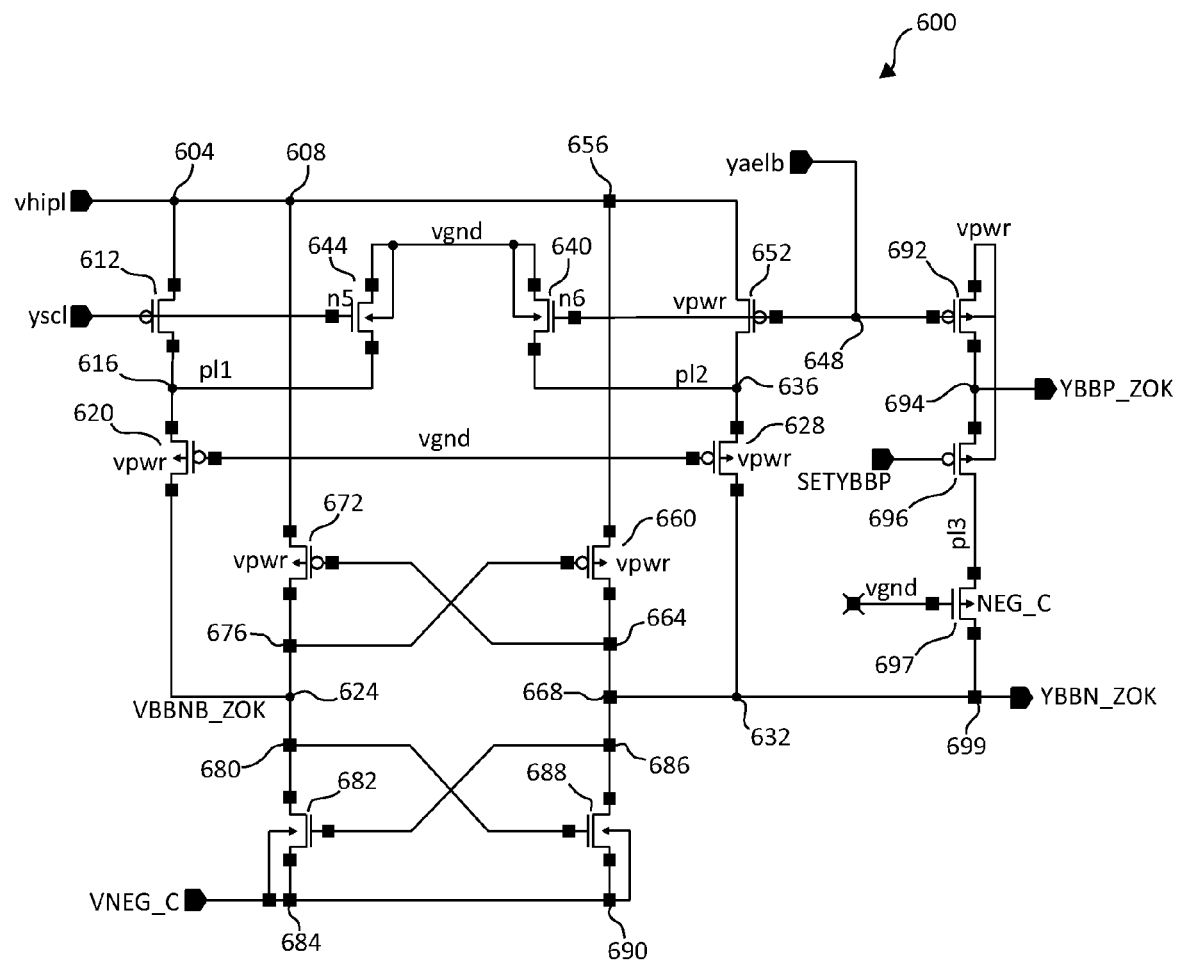
FIG. 6 is a schematic diagram of one embodiment of a protection circuit for transistors.

Referring to FIG. 6, FIG. 6 is a schematic diagram of one embodiment of a protection circuit 600 for transistors. At least in the illustrated embodiment, protection circuit 600 comprises a plurality of inputs (e.g., Vhipl, ysel, VNEG_C, yselb, SETYBBP, and Vgnd).

Vhipl input is coupled to a node 604 that is coupled to a node 608 and the source of a pMOSFET 612. The gate of pMOSFET 612 is coupled to ysel input and the drain of pMOSFET 612 is coupled to a node 616 that is coupled to the source of a pMOSFET 620.

The drain of pMOSFET 620 is coupled to a node 624. The gate of pMOSFET 620 is coupled to the gate of a pMOSFET 628, which has a voltage equal to Vgnd.

The drain of pMOSFET 628 is coupled to a node 632 and the source of pMOSFET 628 is coupled to a node 636 that is coupled to the drain of an nMOSFET 640. The source of nMOSFET 640 is coupled to the source of an nMOSFET 644 and includes a voltage equal to Vgnd.

The gate of nMOSFET 644 is coupled to the ysel input. Also, the drain of nMOSFET 644 is coupled to node 616.

The gate of nMOSFET 640 is coupled to a node 648 and the gate of a pMOSFET 652. The drain of pMOSFET 652 is coupled to node 636 and the source of pMOSFET 652 is coupled to a node 656, which is coupled to node 608 and to the source of a pMOSFET 660.

The drain of pMOSFET 660 is coupled to a node 664 that is coupled to a node 668 and the gate of a pMOSFET 672. The source of pMOSFET 672 is coupled to node 608 and the drain of pMOSFET 672 is coupled to a node 676 that is coupled to the gate of pMOSFET 660 and node 624.

Protection circuit 600 further comprises a node 680 that is coupled to the drain of an nMOSFET 682. The source of nMOSFET 682 is coupled to a node 684 that is coupled to the VNEG_C input. The gate of nMOSFET 682 is coupled to a node 686 that is coupled to node 668 and the drain of an nMOSFET 688.

The gate of nMOSFET 688 is coupled to node 680. The source of nMOSFET 688 is coupled to a node 690 that is coupled to node 684.

Node 648 is coupled to the input yselb and to the gate of a pMOSFET 692. The source of pMOSFET 692 is coupled to Vpwr and the drain of pMOSFET 692 is coupled to a node 694 that is coupled to a positive output YBBP_ZOK and the drain of a pMOSFET 696.

The gate of pMOSFET 696 is coupled to the input SETYBBP and the source of pMOSFET 696 is coupled to the drain of an nMOSFET 697. The gate of nMOSFET 697 is coupled to the input Vgnd and the source of nMOSFET 697 is coupled to a node 699 that is coupled to node 632 and to a negative output YBBN_ZOK.

In the embodiment illustrated in FIG. 6, the SETYBBP input is configured to toggle between different voltage levels. For example, the SETYBBP may toggle between −2Vtp for "high" settings of a negative voltage pump (e.g., NDAC<4> or NDAC<3>=1) and VNEG for a "low" setting for the negative voltage pump (NDAC<4>=NDAC<3>=0). This switching between the two voltage ranges is performed to avoid GOX stress on pMOSFET 696.

Figure 7:
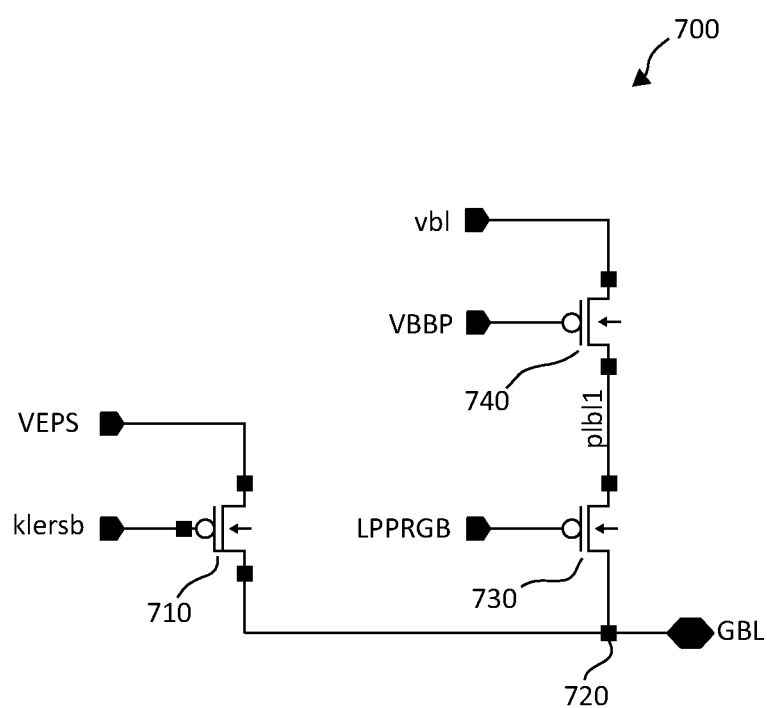
FIG. 7 is a schematic diagram of another embodiment of a protection circuit for transistors.

Turning now to FIG. 7, FIG. 7 is a schematic diagram of another embodiment of a protection circuit 700 for transistors. At least in the illustrated embodiment, protection circuit 700 comprises a plurality of inputs (e.g., VERS, ldersb, vbl, YBBP, and LDPRGB).

The VERS input is coupled to the source of a pMOSFET 710. The gate of pMOSFET 710 is coupled to the ldersb input and the drain of pMOSFET 710 is coupled to a node 720 the is coupled to the drain of a pMOSFET 730 and to an output to a global bit line (GBL).

The gate of pMOSFET 730 is coupled to the LDPRGB input and the source of pMOSFET 730 is coupled to the drain of a pMOSFET 740. The gate of pMOSFET 740 is coupled to the YBBP input and the source of pMOSFET 740 is coupled to the vbl input.

In the embodiment illustrated in FIG. 7, the YBBP input is configured to toggle between different voltage levels. For example, the YBBP may toggle between −2V when the vbl input is passed to the output GBL and Vpwr level when the path is OFF. The LDPRGB input may be either −Vtp for "high" settings of the negative voltage pump (i.e. NDAC<4> or NDAC<3>=1) and VNEG for "low" settings for the negative voltage pump (NDAC<4>=NDAC<3>=0). This switching between the two voltage ranges is performed to avoid GOX stress on pMOSFET 730.

Figure 8:
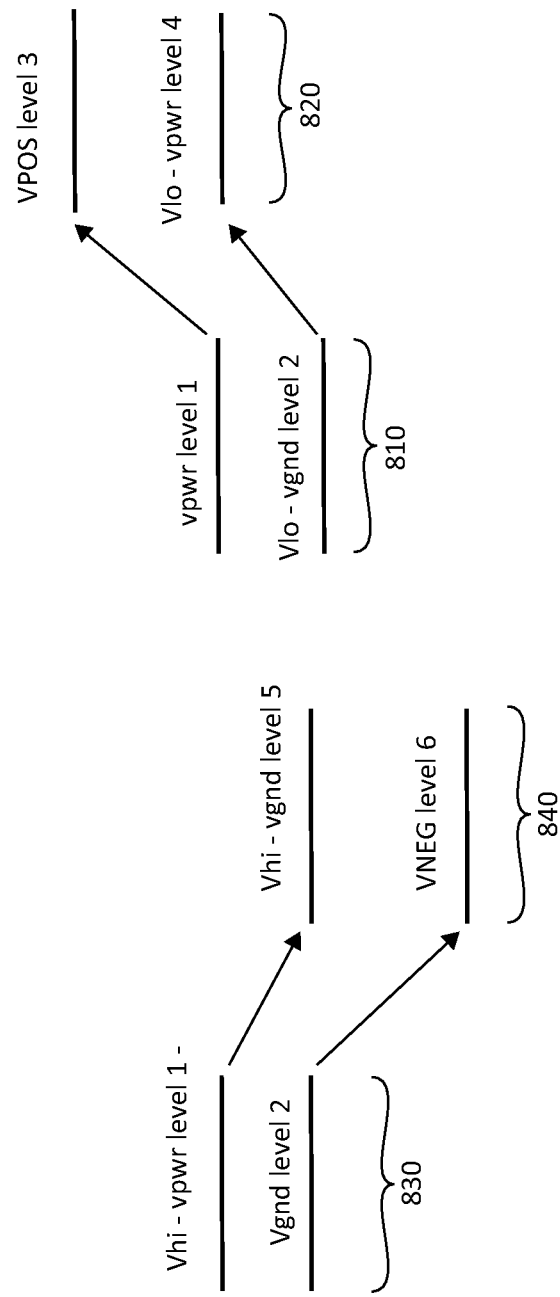
FIG. 8 is a flow diagram of one embodiment of a method for providing voltage from a two-rail level shifting to a memory device.

With reference now to FIG. 8, FIG. 8 is a diagram of one embodiment of a method 800 for providing voltage from a two-rail level shifting (e.g., two-rail level shifting circuit 100, two-rail level shifting circuit 200, and two-rail level shifting circuit 300) to a memory device (e.g., a flash memory device). The right side of FIG. 8 illustrates positive voltage operations (e.g., operations for two-rail level shifting circuit 100 and two-rail level shifting circuit 300), while the left side of FIG. 8 illustrates negative operations (e.g., two-rail level shifting circuit 200 and two-rail level shifting circuit 300) for a two-rail shifting circuit.

On the right side of FIG. 8, method 800 comprises receiving a low voltage input. The low voltage input may have a first voltage (Vpwr or level 1) or a second voltage (Vlo-Vgnd or level 2) that is less than the first voltage (810).

During low voltage operations (e.g. read operations), the output signal can be at the first voltage or the second voltage. During high voltage operations (e.g. erase operations or program operations), the output signal can be at a third voltage (VPOS or level 3) or at a fourth voltage (Vlo or level 4) (820). As illustrated in FIG. 8, the third voltage is greater than the first voltage and the fourth voltage is higher than the second voltage, but less than the third voltage.

On the left side of FIG. 8, method 800 comprises receiving a low voltage input. The low voltage input may have a first voltage (Vhi-Vpwr or level 1) or a second voltage (Vgnd or level 2) that is less than the first voltage (830).

During low voltage operations (e.g. read operations), the output signal can be at the first voltage or the second voltage. During high voltage operations (e.g. erase operations or program operations), the output signal can be at a fifth voltage (Vhi-Vgnd or level 5) or at a sixth voltage (VNEG or level 6) (840). As illustrated in FIG. 8, the fifth voltage is lower than the first voltage, but higher than the sixth voltage and the sixth voltage is lower than the second voltage.

Although the foregoing examples have been described in some detail for purposes of clarity of understanding, the invention is not limited to the details provided. There are many alternative ways of implementing the invention and the disclosed examples and embodiments are illustrative and not restrictive.

What is claimed is:

1. An apparatus, comprising:
   a low voltage input to receive a first voltage; and
   a two-rail level shifting circuit coupled to the low voltage input, the two-rail level shifting circuit to one of:
   increase the first voltage to a second voltage that is greater than the first voltage when programming and erasing a memory device, wherein an amount of the second voltage is based on an amount of the first voltage, and
   decrease the first voltage to a third voltage that is less than or equal to a ground potential when programming and erasing the memory device, wherein an amount of the third voltage is based on an amount of the first voltage.

2. The apparatus of claim 1, wherein the two-rail level shifting circuit is to increase the first voltage to the second voltage that is a first positive voltage, the two-rail level shifting circuit further to increase a fourth voltage to a fifth voltage, which is a second positive voltage, wherein the first positive voltage is greater than the second positive voltage.

3. The apparatus of claim 2, wherein:
   the first voltage is 1.2 volts;
   the fourth voltage is zero volts;
   the first positive voltage is 4.7 volts; and
   the second positive voltage is 1.2 volts.

4. The apparatus of claim 2, further comprising a shifting circuit coupled to the two-rail level shifting circuit, the shifting circuit to receive one of the second voltage and the fifth voltage and utilize the one of the second voltage and the fifth voltage to protect a gate oxide (GOX) of a device providing voltage to the memory device.

5. The apparatus of claim 1, wherein the two-rail level shifting circuit is to increase the first voltage, the two-rail level shifting circuit comprising:
   a first node coupled to the low voltage input;
   a first n-channel metal oxide semiconductor field-effect transistor (nMOSFET) comprising a first gate coupled to the first node, a first source, and a first extended drain;
   an inverter comprising an input coupled to the first node and an output;
   a second nMOSFET comprising a second gate coupled to the output, a second source, and a second extended drain;
   a latch comprising a pair of cross-coupled inverters coupled to the first source and the second source;
   a second node coupled to the first extended drain and the latch;
   a third node coupled to the second extended drain and the latch;
   a complement output coupled to the second node, the complement output providing the first positive voltage if the first voltage is equal the ground potential and providing the second positive voltage if the first voltage is greater than the ground potential; and
   a true output coupled to the third node, the true output providing the first positive voltage if the first voltage is greater than the ground potential and providing the second positive voltage if the first voltage is equal to the ground potential, wherein:
   the true output is provided to the memory device when programming and erasing the memory device.

6. The apparatus of claim 1, wherein the two-rail level shifting circuit is to decrease the first voltage to the third voltage that is a first negative voltage, the two-rail level shifting circuit further to decrease a fourth voltage to a fifth voltage, which is a second negative voltage, wherein the first negative voltage is less than the second negative voltage.

7. The apparatus of claim 6, wherein:
the first voltage is 1.2 volts;
the first voltage is zero volts;
the first negative voltage is −3.6 volts; and
the second negative voltage is zero volts.

8. The apparatus of claim 6, wherein the two-rail level shifting circuit comprises a collapsible power supply to decrease the fourth voltage to the fifth voltage.

9. The apparatus of claim 6, further comprising a protection circuit coupled to the two-rail level shifting circuit, the protection circuit to receive one of the third voltage and the fifth voltage and utilize the one of the third voltage and the fifth voltage to protect a gate oxide (GOX) of a device providing voltage to the memory device.

10. The apparatus of claim 6, wherein the two-rail level shifting circuit is to decrease the first voltage, the two-rail level shifting circuit comprising:
a first node coupled to the low voltage input;
a first p-channel metal oxide semiconductor field-effect transistor (pMOSFET) comprising a first gate coupled to the first node, a first source, and a first extended drain;
an inverter comprising an input coupled to the first node and an output;
a second pMOSFET comprising a second gate coupled to the output, a second source, and a second extended drain;
a latch comprising a pair of cross-coupled inverters coupled to the first source and the second source;
a second node coupled to the first extended drain and the latch;
a third node coupled to the second extended drain and the latch;
a complement output coupled to the second node, the complement output providing the first negative voltage if the first voltage is equal the ground potential and providing the second negative voltage if the first voltage is greater than the ground potential; and
a true output coupled to the third node, the true output providing the first negative voltage if the first voltage is greater than the ground potential and providing the second negative voltage if the first voltage is equal to the ground potential, wherein:
the true output is provided to the memory device when programming and erasing the memory device.

11. The apparatus of claim 1, wherein the first voltage is in the range of 0.5 volts to 3 volts.

12. A system, comprising:
a low voltage input to receive a first voltage; and
a two-rail level shifting circuit coupled to the low voltage input, the two-rail level shifting circuit to:
increase the first voltage to a second voltage, which is a positive voltage, if the first voltage is equal to a ground potential,
decrease the first voltage to a third voltage, which is a negative voltage, if the first voltage is greater than the ground potential, and
provide one of the second voltage and the third voltage to a memory device when programming and erasing the memory device.

13. The system of claim 12, wherein the first voltage is in the range of 0.5 volts to 3 volts, the second voltage is 4.7 volts, the third voltage is −3.6 volts, and the ground potential is zero volts.

14. The system of claim 12, wherein the two-rail level shifting comprises:
a first node coupled to the low voltage input;
a first n-channel metal oxide semiconductor field-effect transistor (nMOSFET) comprising a first gate coupled to the first node, a first source, and a first extended drain;
an inverter comprising an input coupled to the first node and an output;
a second node coupled to the first output;
a second nMOSFET comprising a second gate coupled to the second node, a second source, and a second extended drain;
a first latch comprising a first pair of cross-coupled inverters coupled to the first source, the first extended drain, the second extended drain, and the second source;
a third node coupled to the second extended drain and the first latch;
a first p-channel metal oxide semiconductor field-effect transistor (pMOSFET) comprising a third gate coupled to the third node, a third source coupled to the first latch, and a third extended drain;
a second pMOSFET comprising a fourth gate coupled to the first node, a fourth source, and a fourth extended drain;
a third pMOSFET comprising a fifth gate coupled to the second node, a fifth source, and a fifth extended drain;
a second latch comprising a second pair of cross-coupled inverters coupled to the fourth source, the fourth extended drain, the fifth extended drain, and the fifth source;
a fourth node coupled to the fifth extended drain and the second latch;
a third nMOSFET comprising a sixth gate coupled to the fourth node, a sixth source coupled to the second latch, and a sixth extended drain;
a complement output coupled to the third extended drain and the sixth extended drain, wherein the complement output provides the positive voltage when the first voltage is equal to the ground potential, and wherein the complement output provides the negative voltage when the first voltage is greater than the ground potential.

15. The system of claim 14, wherein:
the first extended drain, the second extended drain, the fourth extended drain, and the fifth extended drain are each a first type of extended drain;
the third extended drain and the sixth extended drain are each a second type of extended drain; and
the second type of extended drain is larger than the first type of extended drain.

16. A method, comprising:
receiving, at the two-rail level shifting circuit, a first voltage;
translating, by the two-rail level shifting circuit, the first voltage to generate one of a plurality of output voltages based on an amount of the first voltage; and
providing the one of the plurality of output voltages to a memory device when programming and erasing the memory device.

17. The method of claim 16, wherein translating the first voltage comprises:
increasing, by the two-rail level shifting circuit, the first voltage to a second voltage in response to the first voltage being equal to a ground potential; and
decreasing, by the two-rail level shifting circuit, the first voltage to a third voltage in response the first voltage being greater than the ground potential.

18. The method of claim 17, wherein:
increasing the first voltage comprises increasing the first voltage from 0 volts to 4.7 volts, which is the second voltage, when the first voltage is equal to the ground potential; and
decreasing the first voltage comprises decreasing the first voltage from 1.2 volts to −3.6 volts, which is the third voltage, when the first voltage is greater than the ground potential.

19. The method of claim 16, wherein translating the first voltage comprises:
increasing, by the two-rail level shifting circuit, the first voltage to a second voltage in response to the first voltage being greater than a ground potential; and
increasing, by the two-rail level shifting circuit, the first voltage to a third voltage in response to the first voltage being equal to the ground potential, wherein:
the third voltage is greater than the ground potential, and
the second voltage is greater than the third voltage.

20. The method of claim 16, wherein translating the first voltage comprises:
decreasing, by the two-rail level shifting circuit, the first voltage to a ground potential in response to the first voltage being greater than the ground potential; and
decreasing, by the two-rail level shifting circuit, the first voltage to a second voltage in response to the first voltage being equal to the ground potential, wherein the second voltage is less than the ground potential.

* * * * *